United States Patent
Liu et al.

(10) Patent No.: US 11,934,106 B2
(45) Date of Patent: Mar. 19, 2024

(54) OPTICAL PROXIMITY CORRECTION DEVICE AND METHOD

(71) Applicant: UNITED MICROELECTRONICS CORP., Hsinchu (TW)

(72) Inventors: Shu-Yen Liu, Tainan (TW); Hui-Fang Kuo, Tainan (TW); Chian-Ting Huang, Tainan (TW); Wei-Cyuan Lo, Taichung (TW); Yung-Feng Cheng, Kaohsiung (TW); Chung-Yi Chiu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 23 days.

(21) Appl. No.: 17/880,700

(22) Filed: Aug. 4, 2022

(65) Prior Publication Data
US 2023/0384689 A1    Nov. 30, 2023

(30) Foreign Application Priority Data

May 30, 2022   (CN) .......................... 202210600470.6

(51) Int. Cl.
*G03F 7/00*   (2006.01)
*G03F 1/36*   (2012.01)

(52) U.S. Cl.
CPC ............ *G03F 7/70441* (2013.01); *G03F 1/36* (2013.01); *G03F 7/705* (2013.01)

(58) Field of Classification Search
CPC ....... G03F 7/70; G03F 7/70425–70441; G03F 7/70483–70541; G03F 7/70591; G03F 7/70616–70683; G03F 1/36; G03F 1/68–70

USPC .... 355/18, 30, 52–55, 67–77; 430/5, 22, 30; 716/50–56

See application file for complete search history.

(56) References Cited

U.S. PATENT DOCUMENTS

| | | | |
|---|---|---|---|
| 6,421,820 B1 | 7/2002 | Mansfield et al. | |
| 6,800,406 B2 | 10/2004 | Tejnil | |
| 6,881,523 B2 | 4/2005 | Smith | |
| 2004/0170905 A1* | 9/2004 | Liebmann | G03F 1/36 716/55 |

(Continued)

FOREIGN PATENT DOCUMENTS

CN     114660889 A    *  6/2022

OTHER PUBLICATIONS

English translation of CN114660889, published Jun. 24, 2022. (Year: 2022).*

*Primary Examiner* — Christina A Riddle
(74) *Attorney, Agent, or Firm* — WPAT, P.C (57) ABSTRACT

An optical proximity correction (OPC) device and method is provided. The OPC device includes an analysis unit, a reverse pattern addition unit, a first OPC unit, a second OPC unit and an output unit. The analysis unit is configured to analyze a defect pattern from a photomask layout. The reverse pattern addition unit is configured to provide a reverse pattern within the defect pattern. The first OPC unit is configured to perform a first OPC procedure on whole of the photomask layout. The second OPC unit is configured to perform a second OPC procedure on the defect pattern of the photomask layout to enhance an exposure tolerance window. The output unit is configured to output the photomask layout which is corrected.

20 Claims, 9 Drawing Sheets

(56) References Cited

U.S. PATENT DOCUMENTS

| | | | |
|---|---|---|---|
| 2007/0226674 A1* | 9/2007 | Haffner | G03F 1/36 |
| | | | 438/689 |
| 2009/0007053 A1* | 1/2009 | Kim | G03F 1/36 |
| | | | 716/53 |
| 2013/0219348 A1* | 8/2013 | Ye | G06F 30/00 |
| | | | 716/52 |
| 2015/0169820 A1* | 6/2015 | Wang | G03F 1/36 |
| | | | 716/53 |
| 2020/0089103 A1* | 3/2020 | Morishita | G03F 1/72 |
| 2020/0356011 A1* | 11/2020 | Su | G03F 7/705 |

* cited by examiner

OPTICAL PROXIMITY CORRECTION DEVICE AND METHOD

This application claims the benefit of People's Republic of China application Serial No. 202210600470.6, filed May 30, 2022, the subject matter of which is incorporated herein by reference.

BACKGROUND OF THE INVENTION

Field of the Invention

The invention relates in general to a device and a method of semiconductor technology, and more particularly to an optical proximity correction (OPC) device and method.

Description of the Related Art

Photolithography process is a crucial process in the manufacturing of a semiconductor device. During the photolithography process, exposure regions and non-exposure regions are defined through the photomask layout, so that a development photoresist can be developed on a photoresist layer. However, due to the scattering of the light, the development photoresist layout does not exactly match the photomask layout and needs to be corrected through optical proximity correction (OPC). The purpose of OPC is for enabling the developed development photoresist to be consistent with a pre-determined pattern without any defects.

However, the exposure machine on the production line may have energy shift or focus shift. To assure the yield rate of the manufacturing process, the conventional OPC technology needs to perform an additional contour repairment on the photomask layout to achieve a sufficient exposure tolerance window.

SUMMARY OF THE INVENTION

The present invention relates to an optical proximity correction (OPC) device and method. A reverse pattern is provided within the defect pattern of a photomask layout to effectively resolve the bridging problem of photoresist patterns. After OPC is performed, the reverse pattern enables the photomask layout to have a sufficient exposure tolerance window, so that there is no need to repair the contour, and a large amount of processing time and human labor can be saved.

According to one embodiment of the present invention, an OPC device is provided. The OPC device includes an analysis unit, a reverse pattern addition unit, a first OPC unit, a second OPC unit and an output unit. The analysis unit is configured to analyze a defect pattern from a photomask layout. The reverse pattern addition unit is configured to provide a reverse pattern within the defect pattern. The first OPC unit is configured to perform a first OPC procedure on whole of the photomask layout. The second OPC unit is configured to perform a second OPC procedure on the defect pattern of the photomask layout to enhance an exposure tolerance window. The output unit is configured to output the photomask layout which is corrected.

According to another embodiment of the present invention, an OPC method is provided. The OPC method includes the following steps. A defect pattern is analyzed from a photomask layout. A reverse pattern is provided within the defect pattern. A first OPC procedure is performed on whole of the photomask layout. A second OPC procedure is performed on the defect pattern of the photomask layout to enhance an exposure tolerance window. A photomask layout which is corrected is outputted.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
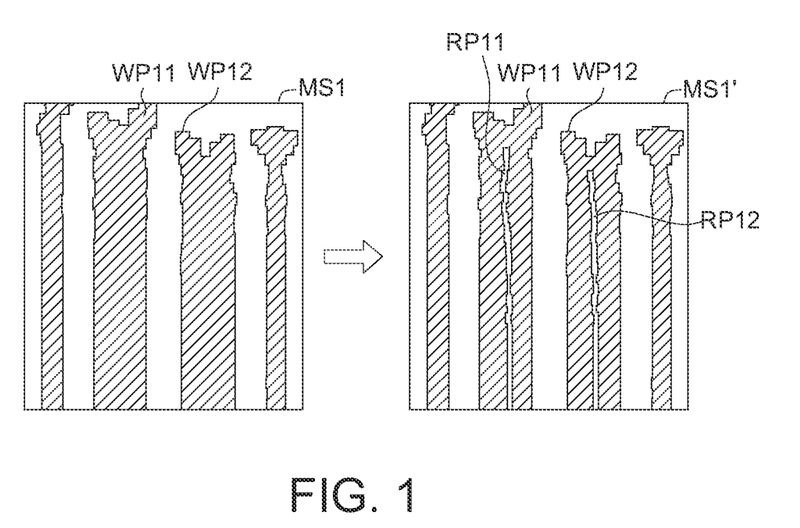
FIG. 1 is a schematic diagram of photomask layouts according to an embodiment.

Referring to FIG. 1, a schematic diagram of photomask layouts MS1 and MS1' according to an embodiment is shown. In the present embodiment, during an OPC procedure, the photomask layout MS1 is additionally provided with reverse patterns RP11 and RP12 with respect to defect patterns WP11 and WP12 to form the photomask layout MS1'. For instance, the defect patterns WP11 and WP12 may easily generate bridging after exposure and development. The defect patterns WP11 and WP12 can be recognized by using a machine learning model or can be detected on a production line.

In FIG. 1, the photomask layout MS1 goes with positive photoresist and adopts a dark tone design of photomask. During the OPC procedure, the photomask layout MS1 is additionally provided with the reverse patterns RP11 and RP12 with respect to the defect patterns WP11 and WP12 to form the photomask layout MS1'. In the photomask layout MS1', the defect patterns WP11 and WP12 are coated with a shading material, and the reverse patterns RP11 and RP12 are not coated with the shading material. Here, a "reverse" refers to a pattern adopting a non-shaded (exposed) design with respect to a shaded (non-exposed) pattern. As indicated in FIG. 1, the shaded defect patterns WP11 and WP12 are respectively hollowed to form the reverse patterns RP11 and RP12.

Figure 2:
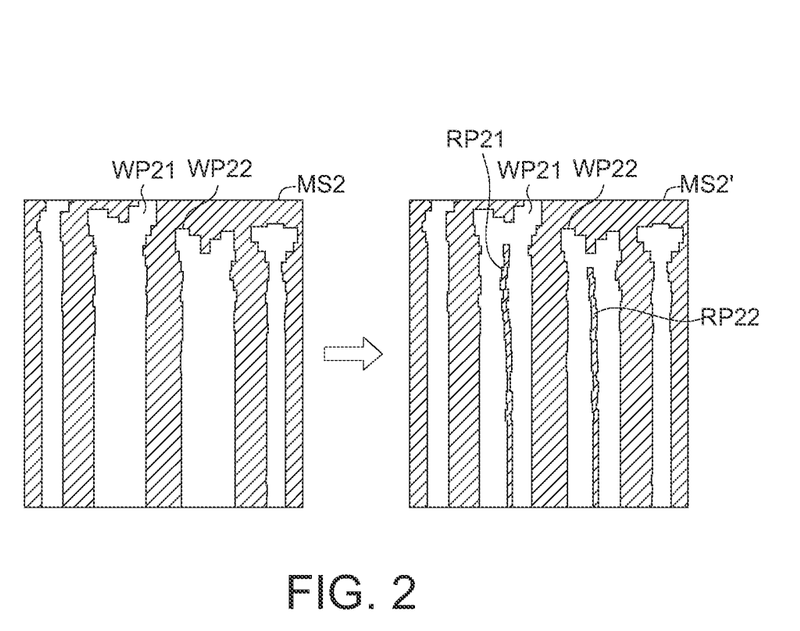
FIG. 2 is a schematic diagram of photomask layouts according to another embodiment.

Referring to FIG. 2, a schematic diagram of photomask layouts MS2 and MS2' according to another embodiment is shown. In FIG. 2, the photomask layout MS2 goes with negative photoresist and adopts a clear tone design of photomask. During the OPC procedure, the photomask layout MS2 is additionally provided with reverse patterns RP21 and RP22 with respect to defect patterns WP21 and WP22 to form the photomask layout MS2'. In the photomask layout MS2', the defect patterns WP21 and WP22 are not coated with a shading material, and the reverse patterns RP21 and RP22 are coated with the shading material. Here, "reverse" refers to a pattern adopting a shaded (non-exposed) design with respect to a non-shaded (exposed) pattern. As indicated in FIG. 2, the non-shaded defect patterns WP21 and WP22 are stuffed with some shading materials to form the reverse patterns RP21 and RP22.

Figure 3:
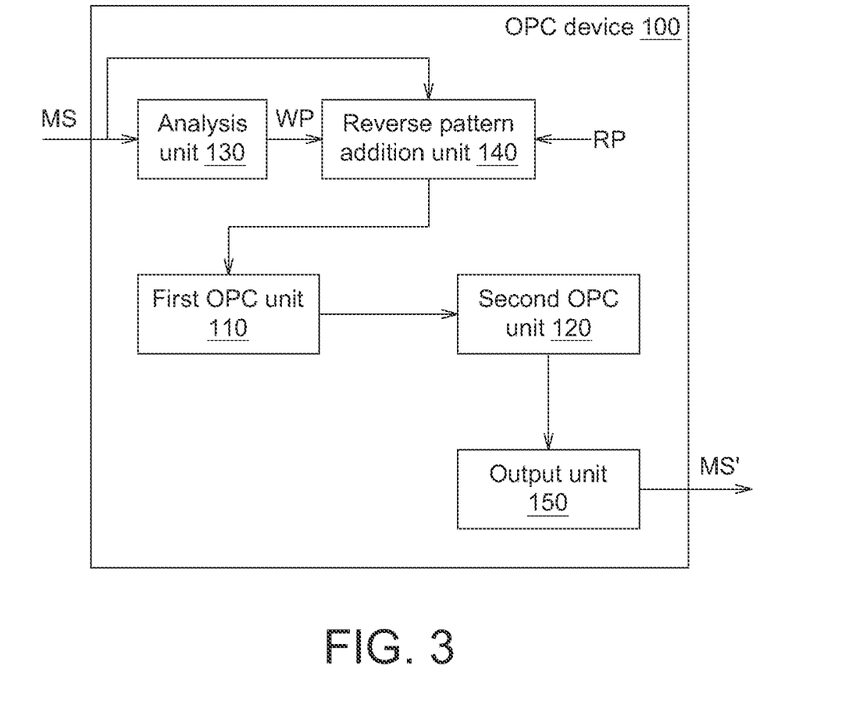
FIG. 3 is a schematic diagram of an OPC device according to an embodiment.

Referring to FIG. 3, a schematic diagram of an OPC device 100 according to an embodiment is shown. The OPC device 100 includes an analysis unit 130, a reverse pattern addition unit 140, a first OPC unit 110, a second OPC unit 120 and an output unit 150. The analysis unit 130 is configured to analyze data. The reverse pattern addition unit 140 is configured to add a reverse pattern. The first OPC unit 110 and the second OPC unit 120 are configured to perform different OPC procedures. The analysis unit 130, the reverse pattern addition unit 140, the first OPC unit 110 and the second OPC unit 120 can be realized by such as a circuit, a chip, a circuit board, code, computer program product, or storage device for storing code. The output unit 150 is configured to output data, and can be realized by such as a display screen, a transmission line, a printing device, or a wired/wireless transmission module. In the present embodiment, the reverse pattern addition unit 140 provides a reverse pattern RP within the defect pattern WP of the photomask layout MS to form the photomask layout MS'. The reverse pattern RP effectively resolves the bridging problem of photoresist patterns and enables the photomask layout MS' to have a sufficient exposure tolerance window. The operations of each of the abovementioned elements are disclosed below with an accompanying flowchart.

Figure 4:
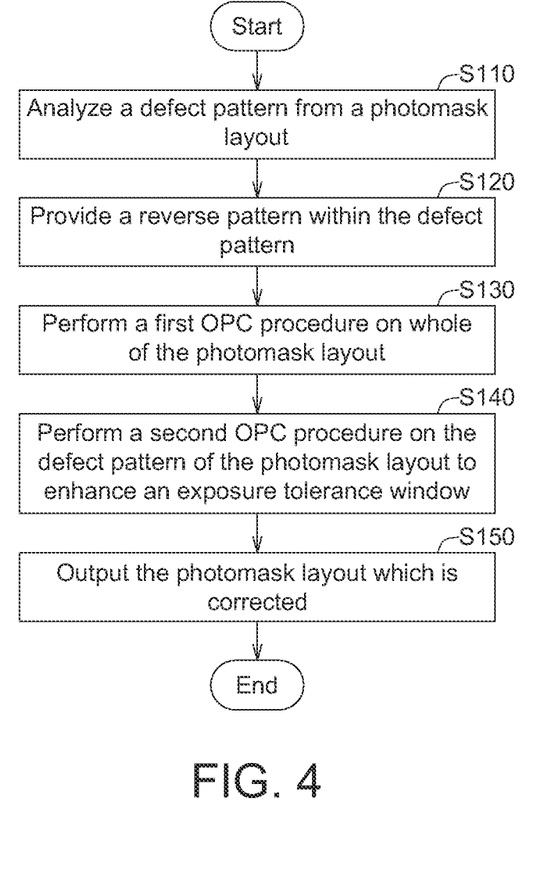
FIG. 4 is a flowchart of an OPC method according to an embodiment.

Referring to FIG. 4, a flowchart of an OPC method according to an embodiment is shown. In step S110, a defect pattern WP on the photomask layout MS is analyzed by the analysis unit 130. The analysis unit 130 can recognize the position and scope of the defect pattern WP on the photomask layout MS by using a machine learning model. Or, the analysis unit 130 can analyze the position and scope of the defect pattern WP according to the information detected on the production line. In an embodiment, the analysis unit 130 can analyze more than one defect patterns WP and then input the defect patterns WP to the reverse pattern addition unit 140.

In step S120, a reverse pattern RP is provided within the defect pattern WP by the reverse pattern addition unit 140. The reverse pattern addition unit 140 provides the reverse pattern RP according to the shape, line width, length, width and interval of the defect pattern WP. The reverse pattern addition unit 140 can recognize the position, scope and shape of the reverse pattern RP on the defect pattern WP by using a machine learning model. Or, the reverse pattern addition unit 140 can calculate the position, scope and shape of the reverse pattern RP according to the defect pattern WP.

Figure 5:
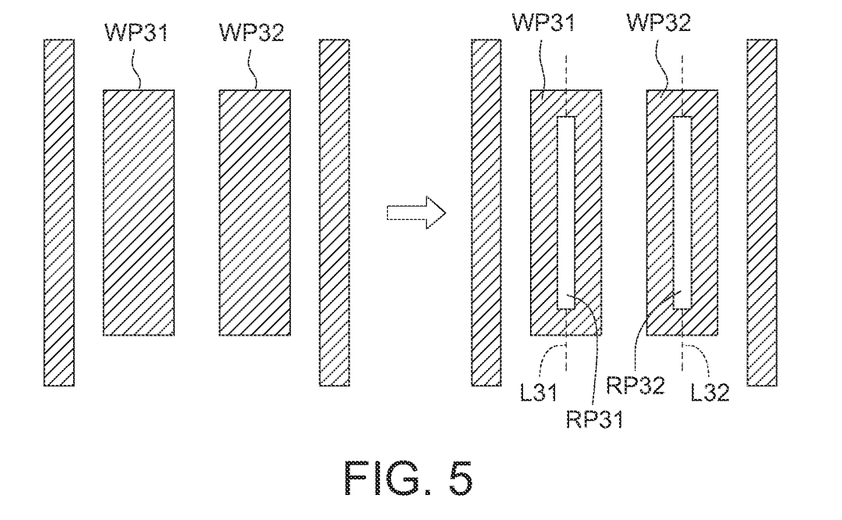
FIG. 5 is an example of providing two reverse patterns.

Referring to FIG. 5, an example of providing two reverse patterns RP31 and RP32 is shown. In the embodiment of FIG. 5, the dark tone design of photomask is adopted, the reverse patterns RP31 and RP32 are respectively provided on two long axes L31 and L32 of two elongated defect patterns WP31 and WP33.

Figure 6:
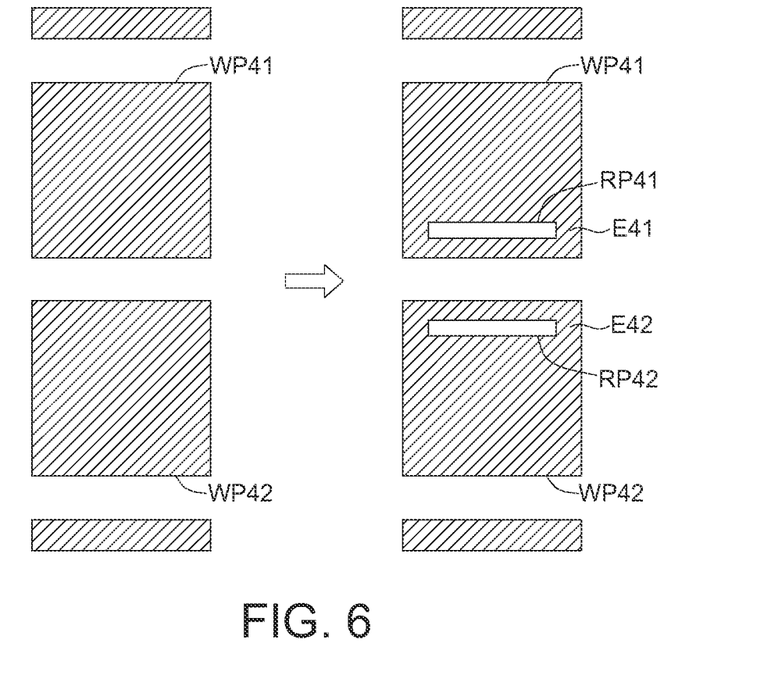
FIG. 6 is an example of providing two reverse patterns.

Referring to FIG. 6, an example of providing two reverse patterns RP41 and RP42 is shown. In the embodiment of FIG. 6, the dark tone design of photomask is adopted, the reverse patterns RP41 and RP42 are respectively provided on two ends E41 and E42 of two blocky defect patterns WP41 and WP43.

Figure 7:
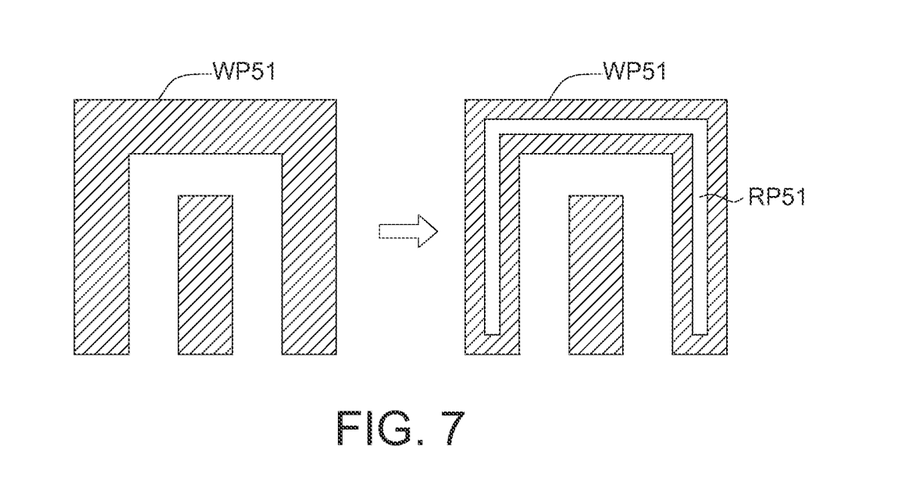
FIG. 7 is an example of providing a reverse pattern is shown.

Referring to FIG. 7, an example of providing a reverse pattern RP51 is shown. In the embodiment of FIG. 7, the dark tone design of photomask is adopted, the reverse pattern RP51 is provided at a center of a bent defect pattern WP51, and the reverse pattern RP51 has a bending shape.

Figure 8:
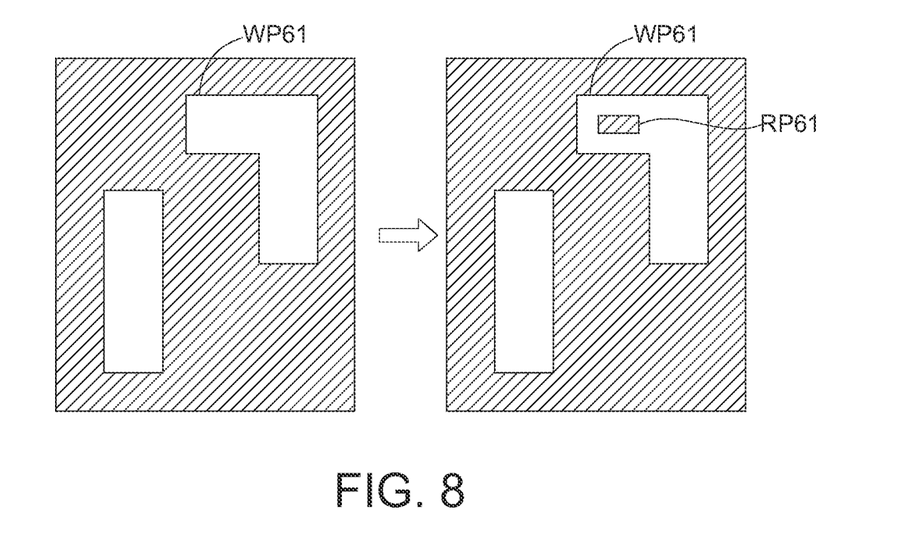
FIG. 8 is an example of providing a reverse pattern.

Referring to FIG. 8, an example of providing a reverse pattern RP61 is shown. In the embodiment of FIG. 8, the clear tone design of photomask is adopted, the reverse pattern RP61 is provided at an end of a bent defect pattern WP61.

In step S130, a first OPC procedure is performed on whole of the photomask layout MS' by the first OPC unit 110. The main purpose of the first OPC procedure is for developing predetermined development photoresist according to the photomask layout MS' without defects.

In step S140, a second OPC procedure is performed on the defect pattern WP of the photomask layout MS by the second OPC unit 120 to enhance an exposure tolerance window. The main purpose of the second OPC procedure is for correcting the reverse pattern RP to enhance the exposure tolerance window.

Figure 9:
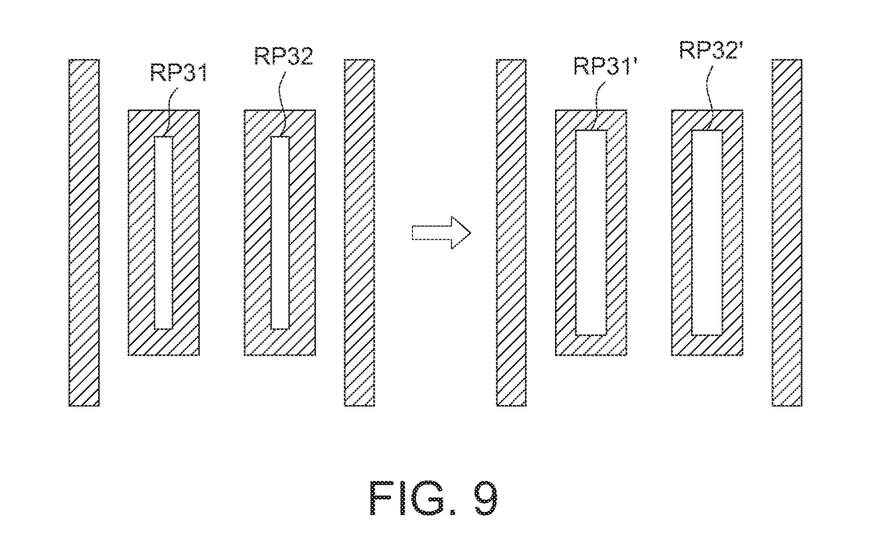
FIG. 9 is an example of correcting two reverse patterns.

Referring to FIG. 9, an example of correcting two reverse patterns RP31 and RP32 is shown. In the embodiment of FIG. 9, the dark tone design of photomask is adopted, and the second OPC unit 120 can adjust the size of the reverse patterns RP31 and RP32 to obtain two wider reverse patterns RP31' and RP32'.

Figure 10:
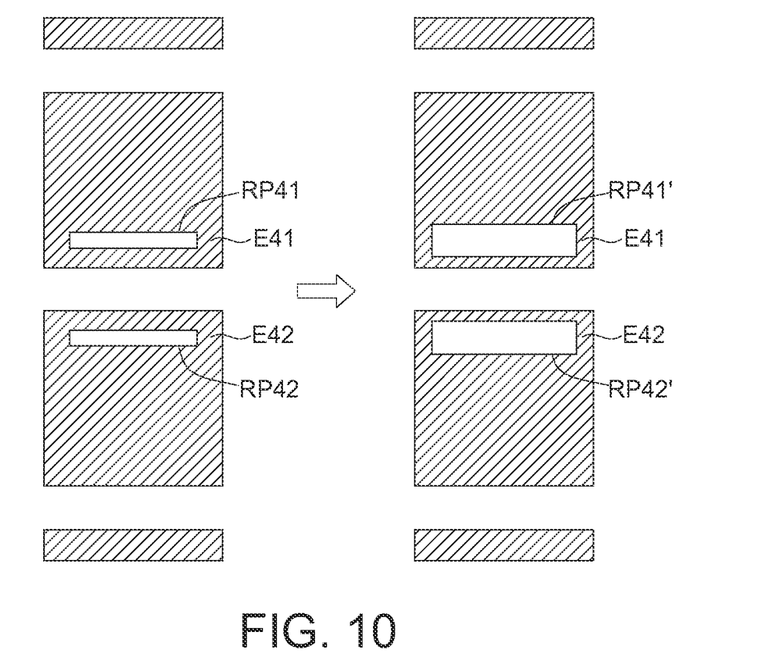
FIG. 10 is an example of correcting two reverse patterns.

Referring to FIG. 10, an example of correcting two reverse patterns RP41 and RP42 is shown. In the embodiment of FIG. 10, the dark tone design of photomask is adopted, the second OPC unit 120 can move the reverse patterns RP41 and RP42 and adjust the size of the reverse patterns RP41 and RP42 to obtain two reverse patterns RP41' and RP42', which are even closer to ends E41 and E42.

Figure 11:
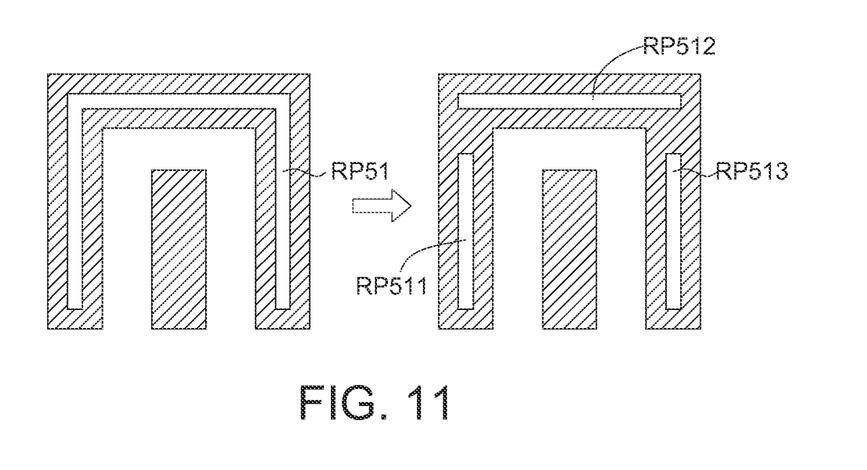
FIG. 11 is an example of correcting a reverse pattern.

Referring to FIG. 11, an example of correcting a reverse pattern RP51 is shown. In the embodiment of FIG. 11, the dark tone design of photomask is adopted, the second OPC unit 120 divides the reverse pattern RP51 into three sections, namely reverse patterns RP511, RP512, and RP513.

Figure 12:
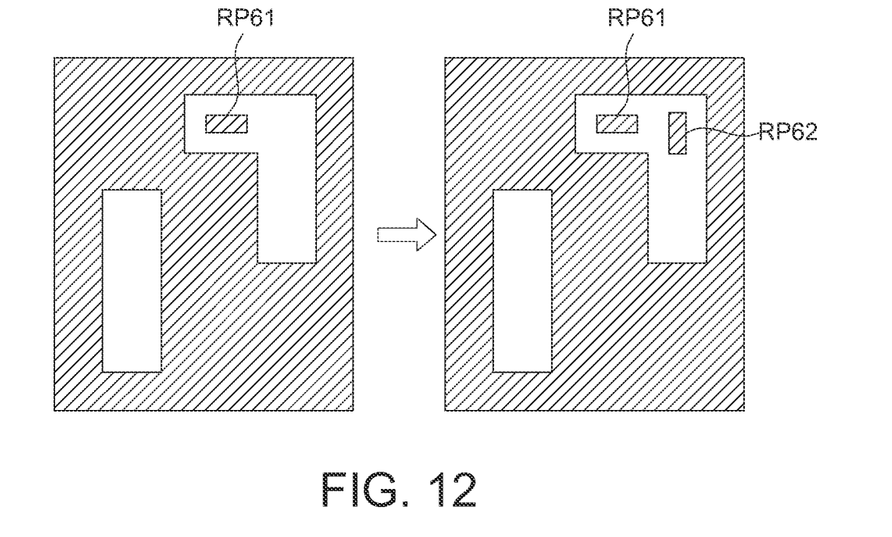
FIG. 12 is an example of correcting two reverse patterns.

Referring to FIG. 12, an example of correcting two reverse patterns RP61 and RP62 is shown. In the embodiment of FIG. 12, the clear tone design of photomask is adopted, the second OPC unit 120 can add another reverse pattern RP62 to obtain the reverse patterns RP61 and RP62.

Figure 13:
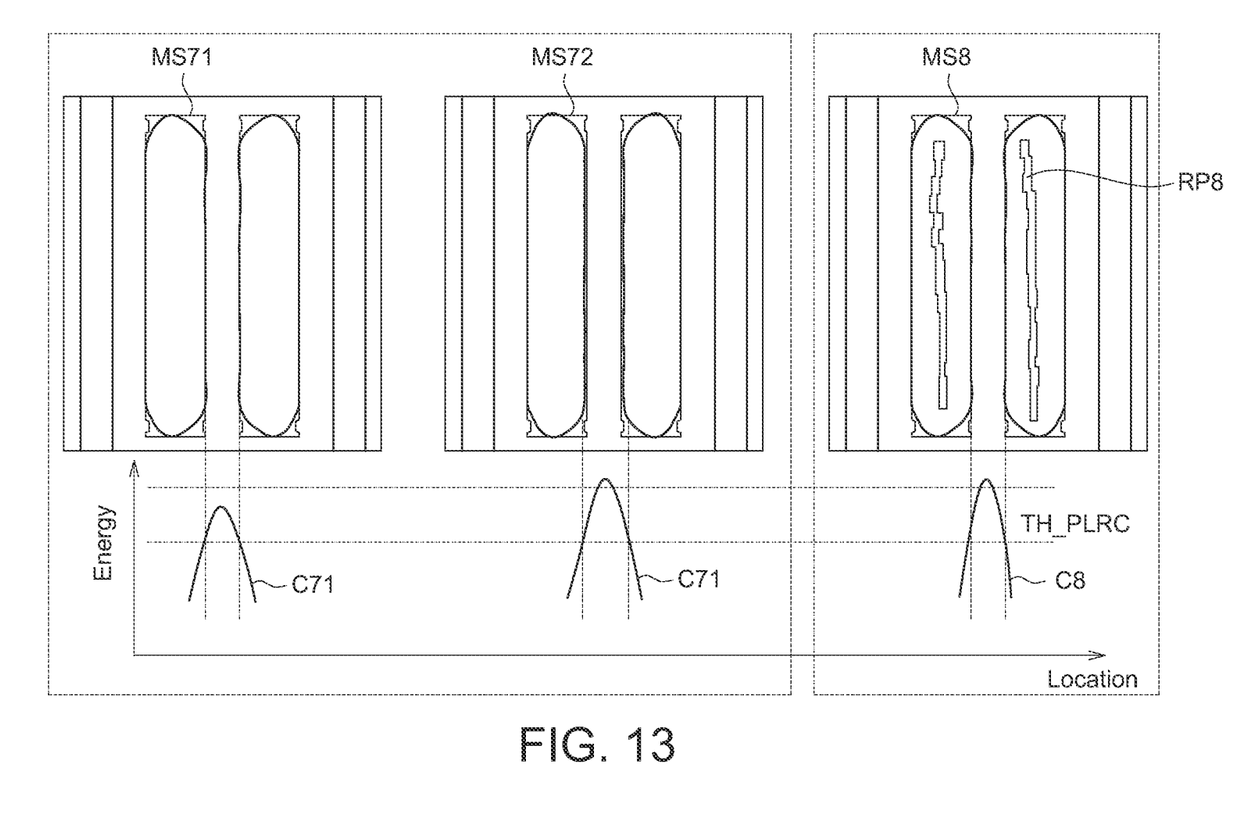
FIG. 13 is a schematic diagram of two energy distribution curves obtained without using any reverse patterns and an energy distribution curve obtained using a reverse pattern.

In step S150, the photomask layout MS' which is corrected is outputted by the output unit 150. Referring to FIG. 13, a schematic diagram of energy distribution curves C71 and C72 obtained without using any reverse patterns and energy distribution curve C8 obtained through the use of reverse pattern C8 is shown. The photomask layout MS71 is not provided with any reverse patterns. After OPC, the maximum energy level of the energy distribution curve C71 corresponding to the photomask layout MS71 does not reach the predetermined level TH_PLRC, and the exposure tolerance window is very narrow. To obtain a sufficient exposure tolerance window, the contour of the photomask layout MS71 needs to be additionally repaired to obtain a repaired photomask layout MS72. The photomask layout MS8 is provided with the reverse pattern RPB. After OPC, the maximum energy level of the energy distribution curve C8 corresponding to the photomask layout MS8 easily reaches the predetermined level TH_PLRC, the exposure tolerance window is sufficient, and the contour of the photomask layout MS8 does not need to be additionally repaired.

Figure 14:
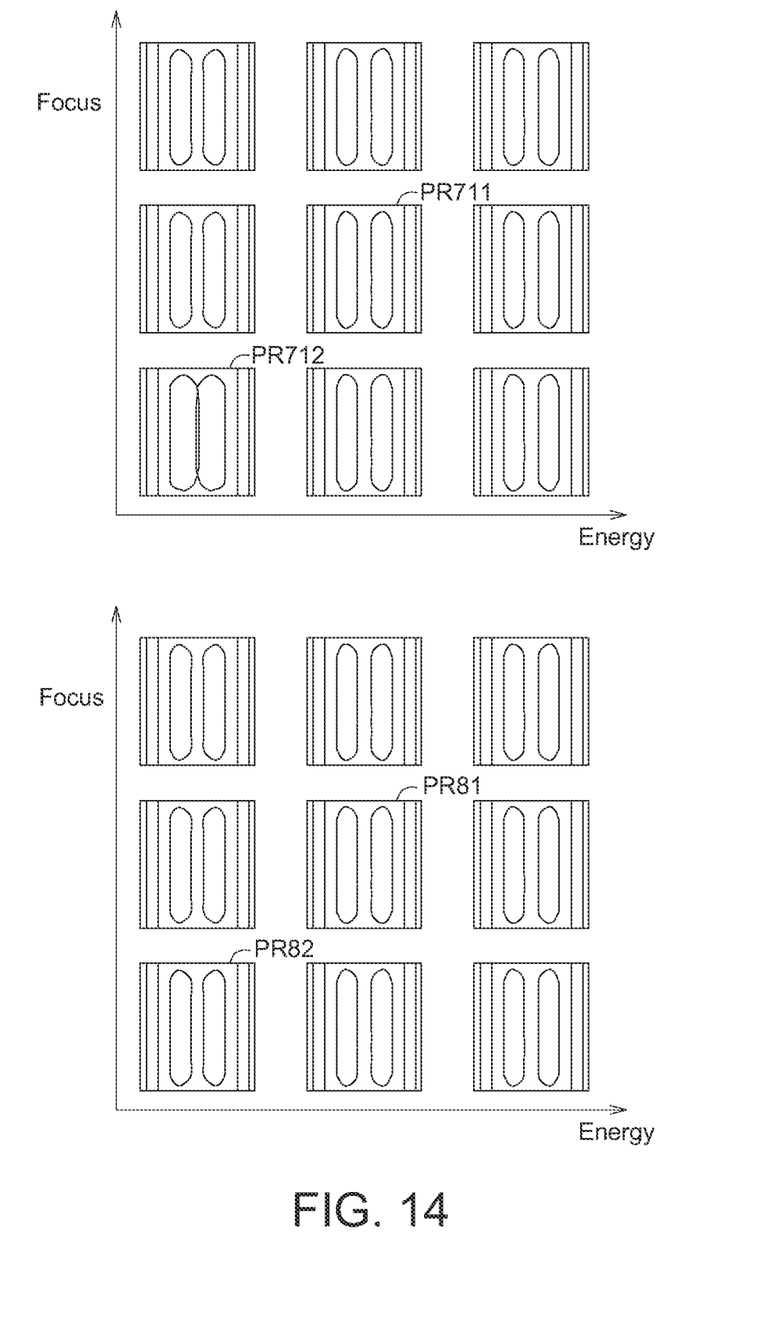
FIG. 14 is a schematic diagram of two development photoresist layouts corresponding to two photomask layouts.

Referring to FIG. 14, a schematic diagram of two development photoresists PR711 and PR712 corresponding to the photomask layout MS71 and two development photoresists PR81 and PR82 corresponding to the photomask layout MS8 is shown. Both of the photomask layout MS71 and the photomask layout MS8 which are unrepaired are obtained after OPC is completed. When both the energy and the focus meet the standard levels, the development photoresist PR711 is obtained via the photomask layout MS71. When both the energy and the focus are lower than the standard levels, the development photoresist PR712 is obtained via the photomask layout MS71. When both the energy and the focus meet the standard levels, the development photoresist PR81 is obtained via the photomask layout MS8. When both the energy and the focus are lower than the standard levels, the development photoresist PR82 is obtained via the photomask layout MS8. A comparison between the development photoresist PR712 and the development photoresist PR82 shows that the development photoresist PR82 is free of bridging, therefore the exposure tolerance window of the photomask layout MS8 is significantly larger than the exposure tolerance window of the photomask layout MS71. The contour of the photomask layout MS71 needs to be additionally repaired, but the photomask layout MS8 does not.

According to the above embodiments, the reverse pattern RP is provided within the defect pattern WP of the photomask layout MS to effectively resolve the bridging problem of photoresist patterns. After OPC, the reverse pattern RP enables the photomask layout MS to have the sufficient exposure tolerance window, so that there is no need to repair the contour, and a large amount of processing time and human labor can be saved.

While the invention has been described by way of example and in terms of the preferred embodiment(s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. An optical proximity correction (OPC) device, comprising:
    an analysis unit configured to analyze a defect pattern from a photomask layout;
    a reverse pattern addition unit configured to provide a reverse pattern within the defect pattern;
    a first OPC unit configured to perform a first OPC procedure on a whole of the photomask layout;
    a second OPC unit configured to perform a second OPC procedure on the reverse pattern within the defect pattern to enhance an exposure tolerance window; and
    an output unit configured to output the photomask layout which is corrected.

2. The OPC device according to claim 1, wherein the second OPC unit moves a position of the reverse pattern.

3. The OPC device according to claim 1, wherein the second OPC unit adjusts a size of the reverse pattern.

4. The OPC device according to claim 1, wherein the second OPC unit provides another reverse pattern.

5. The OPC device according to claim 1, wherein the reverse pattern addition unit provides the reverse pattern on a long axis of the defect pattern.

6. The OPC device according to claim 1, wherein the reverse pattern addition unit provides the reverse pattern by using a machine learning model.

7. The OPC device according to claim 1, wherein the reverse pattern addition unit provides the reverse pattern according to a shape of the defect pattern.

8. The OPC device according to claim 1, wherein the reverse pattern addition unit provides the reverse pattern according to a line width of the defect pattern.

9. The OPC device according to claim 1, wherein the defect pattern is coated with a shading material, and the reverse pattern is not coated with the shading material.

10. The OPC device according to claim 1, wherein the reverse pattern is coated with a shading material, and the defect pattern is not coated with the shading material.

11. An optical proximity correction (OPC) method, comprising:
    analyzing a defect pattern from a photomask layout;
    providing a reverse pattern within the defect pattern;
    performing a first OPC procedure on a whole of the photomask layout;
    performing a second OPC procedure on the reverse pattern within the defect pattern the to enhance an exposure tolerance window; and
    outputting the photomask layout which is corrected.

12. The OPC method according to claim 11, wherein during the second OPC procedure, a position of the reverse pattern is moved.

13. The OPC method according to claim 11, wherein during the second OPC procedure, a size of the reverse pattern is adjusted.

14. The OPC method according to claim 11, wherein during the second OPC procedure, another reverse pattern is provided.

15. The OPC method according to claim 11, wherein the reverse pattern is provided on a long axis of the defect pattern.

16. The OPC method according to claim 11, wherein the reverse pattern is provided by using a machine learning model.

17. The OPC method according to claim 11, wherein the reverse pattern is provided according to a shape of the defect pattern.

18. The OPC method according to claim 11, wherein the reverse pattern is provided according to a line width of the defect pattern.

19. The OPC method according to claim 11, wherein the defect pattern is coated with a shading material, and the reverse pattern is not coated with the shading material.

20. The OPC method according to claim 11, wherein the reverse pattern is coated with a shading material, and the defect pattern is not coated with the shading material.

* * * * *